(12) United States Patent  
Funahashi et al.

(10) Patent No.: US 9,184,700 B2  
(45) Date of Patent: Nov. 10, 2015

(54) DIGITAL AMPLITUDE MODULATOR AND CONTROL METHOD FOR DIGITAL AMPLITUDE MODULATOR

(71) Applicant: KABUSHIKI KAISHA TOSHIBA, Tokyo (JP)

(72) Inventors: Yuuki Funahashi, Tokyo (JP); Seiki Katayama, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/480,349

(22) Filed: Sep. 8, 2014

(65) Prior Publication Data

US 2014/0375393 A1    Dec. 25, 2014

Related U.S. Application Data

(63) Continuation of application No. PCT/JP2012/073680, filed on Sep. 14, 2012.

(30) Foreign Application Priority Data

Mar. 13, 2012  (JP) .................................. 2012-056189

(51) Int. Cl.  
*H03C 1/00*        (2006.01)  
*H03C 1/36*        (2006.01)  
(Continued)

(52) U.S. Cl.  
CPC ............... *H03C 1/36* (2013.01); *H03F 1/0227* (2013.01); *H03F 1/0277* (2013.01); *H03F 1/56* (2013.01); *H03F 3/181* (2013.01); *H03F 3/189* (2013.01);  
(Continued)

(58) Field of Classification Search  
CPC ............................... H03C 1/00; H03F 3/2175  
USPC ................... 332/155, 152, 178; 375/297, 300  
See application file for complete search history.

(56) References Cited

U.S. PATENT DOCUMENTS 4,580,111 A    4/1986  Swanson  
5,454,013 A *  9/1995  Minami et al. ................ 375/297  
(Continued)

FOREIGN PATENT DOCUMENTS

JP    H01-096570 A    4/1989  
JP    H11-330990 A    11/1999  
(Continued)

OTHER PUBLICATIONS

International Search Report mailed by Japan Patent Office on Dec. 4, 2012 in PCT Application No. PCT/JP2012/073680—5 pages.  
(Continued)

*Primary Examiner* — Joseph Chang  
(74) *Attorney, Agent, or Firm* — Knobbe, Martens, Olson & Bear LLP

(57) ABSTRACT

According to one embodiment, a digital amplitude modulator includes a power supply unit, a measurement unit, a calculation unit, and a power controller. The power supply unit supplies a power supply voltage to a plurality of power amplifiers. The measurement unit measures the output power and reflection coefficient of a synthesizer. The calculation unit calculates loss power occurring in each power amplifier in an ON state, and reflected power consumed by each power amplifier in the ON state. The power controller controls all the power amplifiers to be in an OFF state, and performs a normal operation, and controls the input voltage of the power supply unit or ON/OFF of the plurality of power amplifiers.

9 Claims, 7 Drawing Sheets

(51) Int. Cl.
*H03F 1/02* (2006.01)
*H03F 3/189* (2006.01)
*H03F 3/21* (2006.01)
*H03F 3/72* (2006.01)
*H03G 3/30* (2006.01)
*H03F 1/56* (2006.01)
*H03F 3/181* (2006.01)
*H03F 3/24* (2006.01)

(52) U.S. Cl.
CPC ............... *H03F 3/211* (2013.01); *H03F 3/245* (2013.01); *H03F 3/72* (2013.01); *H03G 3/3042* (2013.01); *H03F 2200/171* (2013.01); *H03F 2200/387* (2013.01)

(56) References Cited

U.S. PATENT DOCUMENTS

| | | | |
|---|---|---|---|
| 6,236,284 | B1 | 5/2001 | Duello et al. |
| 6,300,829 | B1 | 10/2001 | Luu |
| 6,816,017 | B2 | 11/2004 | Yamashita et al. |
| 7,408,404 | B2 | 8/2008 | Osman et al. |
| 2003/0218507 | A1 | 11/2003 | Inoue et al. |
| 2007/0132510 | A1 | 6/2007 | Osman et al. |
| 2010/0167668 | A1* | 7/2010 | Nistler et al. ................. 455/101 |

FOREIGN PATENT DOCUMENTS

| | | |
|---|---|---|
| JP | 2001-267849 A | 9/2001 |
| JP | 2002-009637 A | 1/2002 |
| JP | 2002-076791 A | 3/2002 |
| JP | 2003-338714 A | 11/2003 |
| JP | 2006-510256 A | 3/2006 |
| JP | 2011-193259 A | 9/2011 |
| JP | 2012-010082 A | 1/2012 |

OTHER PUBLICATIONS

International Preliminary Report on Patentability for application No. PCT/JP2012/073680, issued on Sep. 16, 2014, by Mineko Mohri.

* cited by examiner

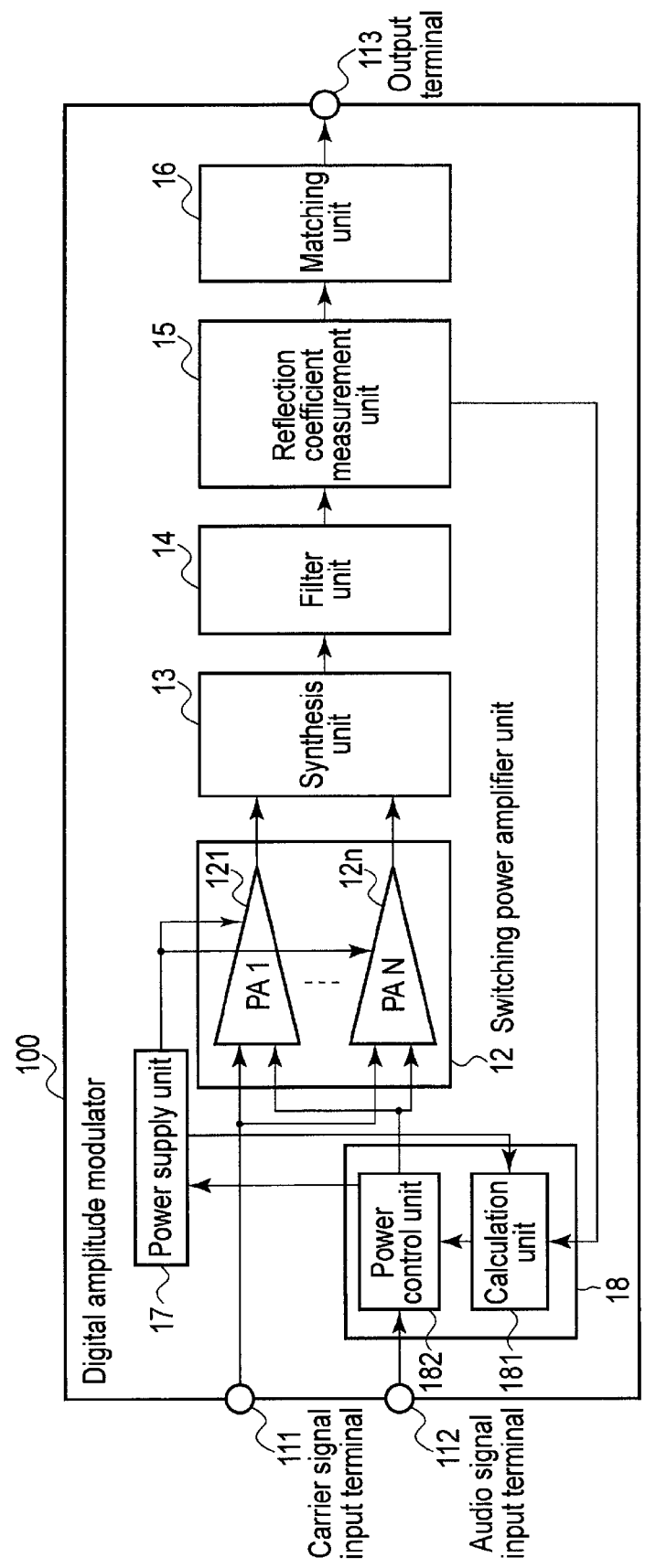
F I G. 1

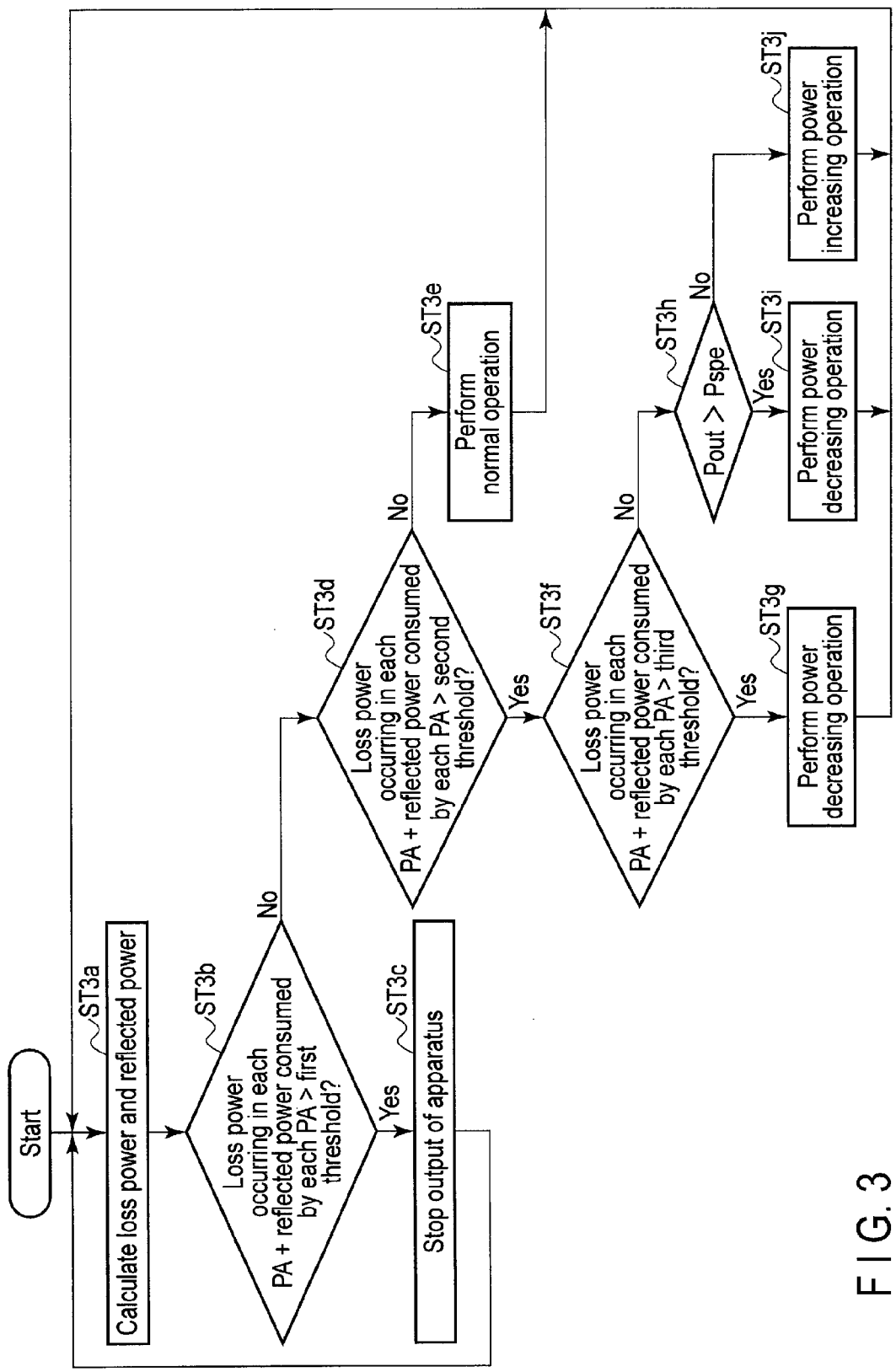
F I G. 3

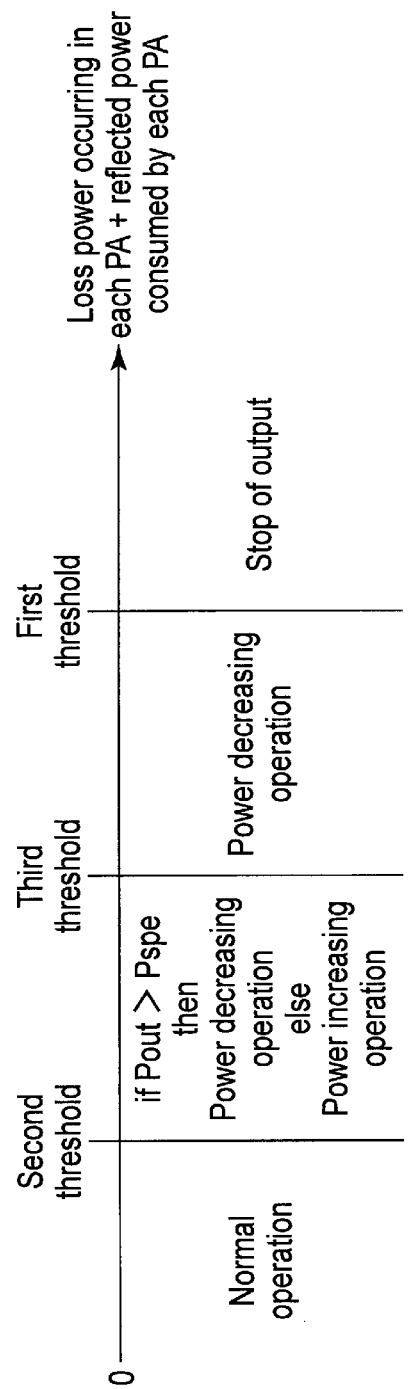
F I G. 4

(a)

| At time of power decreasing operation | At time of power increasing operation |
|---|---|
| Turn off PAs 121 to 125 | Turn on PAs 129 to 1211 |

(b)

| At time of power decreasing operation | At time of power increasing operation |
|---|---|
| Turn off PAs 124 to 128 | Turn on PAs 1211 to 12n |

F I G. 7

DIGITAL AMPLITUDE MODULATOR AND CONTROL METHOD FOR DIGITAL AMPLITUDE MODULATOR

CROSS-REFERENCE TO RELATED APPLICATIONS

This application is based upon and claims the benefit of priority from Japanese Patent Application No. 2012-056189, filed Mar. 13, 2012, International Patent Application No. PCT/JP2012/073680, filed Sep. 14, 2012, the entire contents of both of which are incorporated herein by reference.

FIELD

Embodiments described herein relate generally to, for example, a digital amplitude modulator used in a medium-wave transmission apparatus, and a control method for the digital amplitude modulator.

BACKGROUND

A digital amplitude modulator is used for, for example, medium-wave broadcasting. The digital amplitude modulator includes a plurality of power amplifiers. The digital amplitude modulator ON/OFF-controls the plurality of power amplifiers according to the voltage amplitude level of a signal to be modulated, thereby changing the number of power amplifiers to which amplified carrier signals are output. The digital amplitude modulator generates an Amplitude Modulation (AM) wave by synthesizing the output signals of power amplifiers in an ON state, and sends the generated AM wave to a predetermined broadcasting service area.

In the aforementioned digital amplitude modulator, the signal quality of the AM wave may degrade when, for example, a breakdown of the power amplifier or some failure occurs. When an SWR (Standing Wave Ratio) deteriorates at the time of a lightning strike or the occurrence of an abnormal condition in a load system such as disconnection, failure, or mixing of a surge, it is necessary to prevent a breakdown of the power amplifier.

To prevent the power amplifier from a breakdown caused by reflected power from an antenna or the like, the digital amplitude modulator monitors the SWR (Standing Wave Ratio), and controls output power. For example, there is conventionally proposed a method of setting output power to zero by disconnecting the switch of a transmission circuit when the SWR value exceeds a warning limit. There is also known a method of decreasing transmission power when the SWR value exceeds a given value.

Power which actually causes damage to a power amplifier is the sum of loss power occurring in the power amplifier and reflected power consumed by the power amplifier. Even if, therefore, the reflected power becomes equal to or higher than a given value and the SWR exceeds a set value, this does not always cause a breakdown of the power amplifier. Especially when the SWR value becomes large to increase the reflected power, the output power decreases. In this situation, if an operation of protecting the power amplifier is performed by decreasing the transmission power, the coverage area of a broadcasting service area becomes narrow, thereby degrading the signal quality of the AM wave.

BRIEF DESCRIPTION OF DRAWINGS

FIG. 1 is a block diagram showing the arrangement of a digital amplitude modulator according to the first embodiment.

FIG. 3 is a flowchart illustrating the transmission power control processing procedure of a control unit shown in FIG. 1.

FIG. 4 is a view showing the relationship of a transmission power control operation.

FIG. 7 is a table showing an example of contents stored in an ON/OFF table according to the third embodiment.

DETAILED DESCRIPTION

Figure 2:
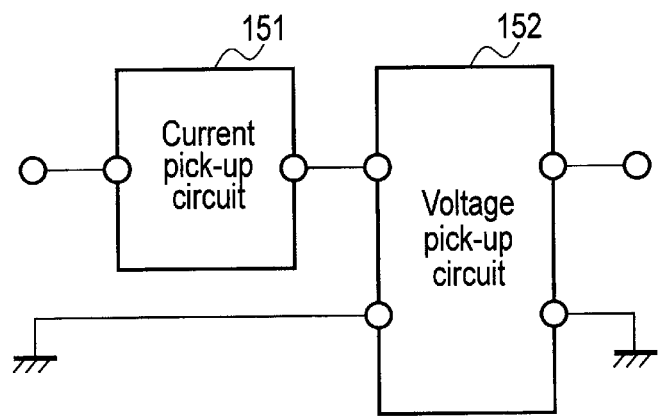
FIG. 2 is a block diagram showing the detailed arrangement of a reflection coefficient measurement unit shown in FIG. 1.

In general, according to one embodiment, a digital amplitude modulator includes normal number of power amplifiers as at least some of a plurality of power amplifiers, a synthesizer, a power supply unit, a measurement unit, and a calculation unit, and a power controller. The power amplifiers are juxtaposed and ON/OFF-controllable according to a voltage amplitude level of a transmission signal to be modulated. The power amplifiers amplify a power of the transmission signal. The synthesizer synthesizes outputs of the respective power amplifiers to generate an amplitude modulation wave, and sends the generated amplitude modulation wave to a predetermined broadcasting service area. The power supply unit supplies a power supply voltage to the plurality of power amplifiers. The measurement unit measures output power and a reflection coefficient of the synthesizer. The calculation unit calculates, based on the output power and the reflection coefficient that is measured by the measurement unit, and information of input power supplied by the power supply unit, loss power occurring in each power amplifier in an ON state and reflected power consumed by each power amplifier in the ON state. The power controller controls all the power amplifiers to be in an OFF state when a sum of the loss power and the reflected power that is calculated by the calculation unit is higher than a first threshold which is an upper limit of a tolerance range, performs a normal operation of setting the normal number of power amplifiers in the ON state when the sum is lower than a second threshold which is a lower limit of the tolerance range, compare the output power with normal rated power defined by digital broadcasting when the sum of the loss power and the reflected power falls within a range from the second threshold (inclusive) to the first threshold (inclusive), and control an input voltage of the power supply unit or ON/OFF of the plurality of power amplifiers to perform a power increasing operation of increasing the output power obtained at the time of the normal operation or a power decreasing operation of decreasing the output power obtained at the time of the normal operation, based on the comparison result.

Embodiments will be described below with reference to the accompanying drawings.

First Embodiment

According to the first embodiment, at the time of a normal operation, a digital amplitude modulator is operated by controlling all power amplifiers in an ON state.

FIG. 1 is a block diagram showing the arrangement of a digital amplitude modulator according to the first embodiment.

Carrier signals are input to a carrier signal input terminal 111 of a digital amplitude modulator 100 shown in FIG. 1. The carrier signals input to the carrier signal input terminal 111 are distributed and supplied to n (n is an arbitrary natural number) power amplifiers 121 to 12n of a switching power amplifier (PA) unit 12. Each of the power amplifiers 121 to 12n is turned on (=a driving state) or turned off (=a stop state) according to an ON/OFF control signal or the phase difference between the carrier signals, and outputs the carrier signal amplified in the ON state.

A synthesis unit 13 synthesizes the carrier signals in the ON state, and a filter unit 14 removes unnecessary harmonic components from the synthesized carrier signal. The thus obtained signal is sent from a transmission antenna (not shown) to a predetermined region via an output terminal 113 as a broadcasting wave which has undergone impedance matching by a matching unit 16 via a reflection coefficient measurement unit 15, and has been amplified and modulated. The transmission antenna is generally connected at the succeeding stage of the output terminal 113. However, a matching circuit, filter, or rejector may be inserted between the output terminal 113 and the transmission antenna. The order of the components from the synthesizer 13 to the matching unit 16 may be different from that shown in FIG. 1, and may be changed. Even if, among the circuits from the synthesizer 13 to the matching unit 16, circuits except for the reflection coefficient measurement unit 15 are omitted from the digital amplitude modulator 100, there is essentially no problem as long as circuits for implementing the same functions exist before the antenna.

A power supply unit 17 supplies a power supply voltage to each of the power amplifiers 121 to 12n.

On the other hand, a current signal and voltage signal generated by the synthesis unit 13 are supplied to the reflection coefficient measurement unit 15 via the filter unit 14. The reflection coefficient measurement unit 15 includes a current pick-up circuit 151 and a voltage pick-up circuit 152, as shown in FIG. 2. The current pick-up circuit 151 picks up the input current signal, and the voltage pick-up circuit 152 picks up the input voltage signal. The reflection coefficient measurement unit 15 obtains the reflection coefficient of the output and the output power of the filter unit 14 based on the picked-up current signal and voltage signal, and supplies the calculation result to a control unit 18.

The control unit 18, which chiefly composed of a Central Processing Unit (CPU), generates a control signal for ON/OFF-controlling the power amplifiers 121 to 12n according to the voltage amplitude of an audio signal input to an audio signal input terminal 112, or generates a control signal for controlling the phases of the carrier signals to ON/OFF-control the power amplifiers 121 to 12n, and includes a calculation unit 181 and a power control unit 182.

Based on traveling power+reflected power (a traveling voltage+a reflected voltage) measured by the reflection coefficient measurement unit 15, output power (an output voltage)+the reflection coefficient and a power supply voltage+a power supply current from the power supply unit 17, or information of input power, the calculation unit 181 calculates loss power occurring in each of the power amplifiers 121 to 12n in the ON state and reflected power consumed by each of the power amplifiers 121 to 12n in the ON state.

Based on the sum of the loss power and reflected power calculated by the calculation unit 181, the power control unit 182 controls transmission power and ON/OFF-controls the power amplifiers 121 to 12n.

An operation in the above-described arrangement will be described next.

FIG. 3 is a flowchart illustrating the transmission power control processing procedure of the control unit 18.

The control unit 18 calculates reflected power Pref and loss power Ploss (step ST3a). For example, as indicated by the reflection coefficient measurement unit 15 of FIG. 2, it is possible to obtain $(v1-v2)/(v1+v2)=Vr/Vf=\Gamma\exp(j\theta)=\rho$ based on output power Pout, traveling wave Vf, a reflected wave Vr, a voltage v1 picked up by the voltage pick-up unit 152, and a voltage v2 picked up by a voltage pick-up unit (not shown) $\lambda/4$ away from the voltage v1. Alternatively, it is possible to obtain the reflection coefficient $\rho=\Gamma\exp(j\theta)=(v1-v2)/(v1+v2)$ using the voltage v1 picked up by the voltage pick-up unit 152 and the voltage v2 which has a phase different from that of the voltage v1 by $\pi/2$, and has been obtained from a current i picked up by the current pick-up unit 151.

The reflected power $Pfer=\Gamma^2 Pout/(1-\Gamma^2)$ can be obtained based on the reflection coefficient $\rho$ and the output power or output voltage.

On the other hand, based on a number N of power amplifiers 121 to 12n in the ON state, input power Pin calculated from the power supply current and power supply voltage from the power supply unit 17, and the traveling power $Pfor=Pout/(1-\Gamma^2)$, the loss power $Ploss=f(N, Pin, Pfor)$ is obtained using a function f(x).

In the first embodiment, the tolerance range of the loss power amount of each of the power amplifiers 121 to 12n is determined not to narrow the broadcasting service area, degrade the signal quality of the AM wave, and cause a breakdown of the power amplifiers 121 to 12n. There are two methods of setting thresholds within the tolerance range. The first method is to protect each of the power amplifiers 121 to 12n by reducing the processing load of the control unit 18. The second method is to reliably protect each of the power amplifiers 121 to 12n.

(First Method)

The first method sets, within the tolerance range, the upper limit threshold of the loss power amount of each of the power amplifiers 121 to 12n as the first threshold, and the lower limit threshold of the loss power amount as the second threshold.

Note that when the first threshold is exceeded, a breakdown may occur in each of the power amplifiers 121 to 12n. When the loss power amount of each of the power amplifiers 121 to 12n becomes higher than the second threshold, the broadcasting service area may narrow and the signal quality of the AM wave may degrade.

The control unit 18 compares, with the first threshold, the sum of the loss power occurring in each of the power amplifiers 121 to 12n and the reflected power consumed by each of the power amplifiers 121 to 12n (step ST3b). If the sum is higher than the first threshold (YES), the control unit 18 performs processing of stopping the output of the apparatus, that is, processing of turning off the active power amplifiers 121 to 12n (step ST3c), and the process transits to the processing in step ST3a.

If a loss occurs in all the power amplifiers 121 to 12n, the loss power occurring in each of the power amplifiers 121 to 12n is $Ploss\_n=(Pin-Pfor)/N$, and the reflected power consumed by each of the power amplifiers 121 to 12n is $Pref\_n=Pref/N$.

If the sum of the loss power occurring in each of the power amplifiers 121 to 12n and the reflected power consumed by each of the power amplifiers 121 to 12n is equal to or lower than the first threshold in step ST3b (NO), the control unit 18 determines whether the sum of the loss power occurring in each of the power amplifiers 121 to 12n and the reflected power consumed by each of the power amplifiers 121 to 12n is higher than the second threshold (step ST3d).

If the sum of the loss power occurring in each of the power amplifiers 121 to 12n and the reflected power consumed by each of the power amplifiers 121 to 12n is equal to or lower than the second threshold (NO), the control unit 18 ON-controls each of the power amplifiers 121 to 12n to normally operate (step ST3e).

On the other hand, if the sum of the loss power occurring in each of the power amplifiers 121 to 12n and the reflected power consumed by each of the power amplifiers 121 to 12n is higher than the second threshold (YES), the control unit 18 compares the output power Pout with normal rated power Pspe defined by digital broadcasting system. If the output power Pout is higher than the normal rated power Pspe, the control unit 18 executes an operation of decreasing the transmission power. If the output power Pout is equal to or lower than the normal rated power Pspe, the control unit 18 executes an operation of increasing the transmission power.

(Second Method)

FIG. 4 shows the relationship of the transmission power control operation as the second method according to the first embodiment (the ordinate represents operation contents, and the abscissa represents the loss power amount of each of the power amplifiers 121 to 12n).

Assume that within the tolerance range, the upper limit threshold of the loss power amount of each of the power amplifiers 121 to 12n is set as the first threshold, the lower limit threshold of the loss power amount is set as the second threshold, and the third threshold is set between the first threshold and the second threshold. Note that when the first threshold is exceeded, a breakdown may occur in each of the power amplifiers 121 to 12n. When the loss power amount of each of the power amplifiers 121 to 12n becomes higher than the second threshold, the broadcasting service area may narrow, and the signal quality of the AM wave may degrade. Note also that the third threshold is set to be equal to the first threshold in the above-described first method. In the second method, the third threshold is set to a value which falls within the range from the second threshold (exclusive) to the first threshold (exclusive).

When the third threshold is set, the control unit 18 controls the input voltage of the power supply unit 17 or ON/OFF-controls each of the power amplifiers 121 to 12n so as to execute an operation of decreasing the transmission power before the sum of the loss power occurring in each of the power amplifiers 121 to 12n and the reflected power consumed by each of the power amplifiers 121 to 12n reaches the first threshold at which a breakdown occurs in each of the power amplifiers 121 to 12n. That is, a region where no operation of increasing the transmission power is executed is provided between the third threshold (a region where whether to decrease or increase the power is determined) and the first threshold to reliably protect each of the power amplifiers 121 to 12n.

If it is determined in step ST3d that the sum of the loss power occurring in each of the power amplifiers 121 to 12n and the reflected power consumed by each of the power amplifiers 121 to 12n is higher than the second threshold (YES), the control unit 18 performs magnitude determination processing by comparing the sum with the third threshold (step ST3f). If the sum is higher than the third threshold (YES), the control unit 18 executes an operation of decreasing the transmission power (step ST3g).

A method of increasing/decreasing the transmission power is implemented by changing the power supply voltage of the power supply unit 17 or changing the number of power amplifiers 121 to 12n in the ON state.

On the other hand, if it is determined in step ST3f that the sum is equal to or lower than the third threshold (NO), the control unit 18 compares the output power Pout with the normal rated power Pspe defined by digital broadcasting system (step ST3h). If the output power Pout is higher than the normal rated power Pspe (YES), the control unit 18 executes an operation of decreasing the transmission power (step ST3i). If the output power Pout is equal to or lower than the normal rated power Pspe (NO), the control unit 18 executes an operation of increasing the transmission power (step ST3j).

The control unit 18 can also control the transmission power using a load impedance Zload and matching impedance Zmn. The load impedance is equal to an antenna impedance (when no impedance conversion circuit exists at an output terminal and antenna terminal), and the matching impedance is an impedance obtained by considering the power amplifiers 121 to 12n to the transmission antenna. In a matching state, Zload=Zmn*. In a non-matching state, that is, when Zload≠Zmn, the loss power occurring in each of the power amplifiers 121 to 12n and the reflected power consumed by each of the power amplifiers 121 to 12n become high. When Re(Zload)>Re(Zmn), a power increasing operation is performed. When Re(Zload)<Re(Zmn), a power decreasing operation is performed. Alternatively, whether to increase or decrease the power can be determined based on the value of ρ using a relationship "ρ=(Zmn−Zload)/(Zmn+Zload)".

For example, consider a state in which the input power is 1.1 kW and the normal rated power 1.0 kW (when 25 PAs are in the ON state). Assume that the output power is 0.75 kW, a voltage pick-up unit 1 picks up the voltage v1, and a voltage pick-up unit 2 λ/4 away from the voltage v1 picks up the voltage v2. The reflection coefficient ρ=(v1−v2)/(v1+v2) =Γexp(jθ) is calculated using the two voltages. Assume that Γ=0.5 and θ=0 are obtained. In this case, an SWR is 3.0, and a reflected power of 0.25 kW and a traveling power of 1 kW can be calculated from the output power.

The loss power Ploss_n generated by each of the power amplifiers 121 to 12n and the reflected power Pref_n consumed by each of the power amplifiers 121 to 12n are obtained. Assume that the loss power Ploss, that is, the difference between the input power Pin and the traveling power Pfor is equally lost in 25 power amplifiers 121 to 1225. In this case, the loss power Ploss_n occurring in each of the power amplifiers 121 to 1225 is 4 W. For the descriptive purpose, a loss which occurs in a transmission path or the like is assumed to be unlimitedly lower than that due to the parasitic resistance of the power amplifiers 121 to 1225.

On the other hand, assume that the reflected power Pref, that is, the difference between the traveling power Pfor and the output power Pout is equally lost in the 25 power amplifiers 121 to 1225. In this case, the reflected power Pref_n consumed by each of the power amplifiers 121 to 1225 is 10 W. For the descriptive purpose, a loss which occurs in a transformer generally used for a synthesis unit or the like, a power regenerated to the power supply, or the like is assumed to be unlimitedly lower than a power consumed by the parasitic resistance of the power amplifiers 121 to 12n, or not to be included in the reflected power.

The operation according to the flowchart is confirmed by setting the first threshold to 50 W, the second threshold to 10

W, and the third threshold to 25 W. Since the sum of the loss power occurring in each of the power amplifiers 121 to 1225 and the reflected power consumed by each of the power amplifiers 121 to 1225 is 14 W, the sum is lower than the first threshold. Therefore, the sum of the loss power occurring in each of the power amplifiers 121 to 1225 and the reflected power consumed by each of the power amplifiers 121 to 1225 is compared with the second threshold.

Since the sum of the loss power occurring in each of the power amplifiers 121 to 1225 and the reflected power consumed by each of the power amplifiers 121 to 1225 is 14 W, the sum is higher than the second threshold. Therefore, the sum of the loss power occurring in each of the power amplifiers 121 to 1225 and the reflected power consumed by each of the power amplifiers 121 to 1225 is compared with the third value.

Since the sum of the loss power occurring in each of the power amplifiers 121 to 1225 and the reflected power consumed by each of the power amplifiers 121 to 1225 is 14 W, the sum is lower than the third threshold. Therefore, the output power and the normal rated power are compared with each other.

Since the output power is 0.75 kW and the normal rated power is 1.0 kW, a power increasing operation is performed according to the flowchart. In this example, the power increasing operation is implemented by increasing the power supply voltage of the power supply unit 17. After that, the reflection coefficient is recalculated, thereby repeatedly executing transmission power control. As an execution frequency, it is assumed to repeat the control processing all the time. There is essentially no problem even if the control processing is executed only several times per day.

As described above, according to the first embodiment, the reflection coefficient measurement unit 15 measures the reflection coefficient and the output power of the synthesis unit 13, and the control unit 18 obtains the sum of the loss power and the reflected power based on the measurement result and information of the input power of the power supply unit 17, and respectively sets, as the first and second thresholds, the upper and lower limits of the tolerance range which does not narrow the broadcasting service area, degrade the signal quality of the AM wave, and cause a breakdown of each of the power amplifiers 121 to 12n. If the sum of the loss power and the reflected power exceeds the second threshold as the lower limit of the tolerance range at the time of the normal operation, the control unit 18 determines whether to perform a power increasing operation or power decreasing operation by comparing the output power measured by the reflection coefficient measurement unit 15 with the normal rated power defined by digital broadcasting system.

In addition to the sum of the loss power and the reflected power within the tolerance range, in accordance with whether the output power measured by the reflection coefficient measurement unit 15 exceeds the normal rated power, an appropriate operation of protecting the power amplifiers 121 to 12n can be performed. This makes it possible to perform a stable operation of protecting the power amplifiers 121 to 12n while continuing transmission of the AM wave without narrowing the coverage of the broadcasting service area or degrading the signal quality of the AM wave. This is very effective especially for protection of the power amplifiers 121 to 12n at the time of a lightning strike, protection of the power amplifiers 121 to 12n when the SWR deteriorates, or measures against a wiring mistake, disconnection, or the like.

According to the aforementioned first embodiment, when the control unit 18 sets the third threshold between the first threshold and the second threshold within the tolerance range, a region where no operation of increasing the transmission power is executed is provided between the third threshold and the first threshold. Therefore, if the sum of the loss power and the reflected power is higher than the third threshold, a power decreasing operation is performed before the sum reaches the first threshold at which a breakdown occurs in each of the power amplifiers 121 to 12n, thereby reliably protecting the power amplifiers 121 to 12n while continuing transmission of the AM wave, and further reducing the probability that a breakdown occurs in each of the power amplifiers 121 to 12n.

Furthermore, according to the aforementioned first embodiment, if the sum of the loss power and the reflected power is equal to or lower than the third threshold, the control unit 18 controls the input voltage of the power supply unit 17 so as to perform a power decreasing operation when the output power measured by the reflection coefficient measurement unit 15 is higher than the normal rated power, and perform a power increasing operation only when the output power is equal to or lower than the normal rated power, thereby further improving the reliability when the power increasing operation is performed.

Second Embodiment

According to the second embodiment, at the time of a normal operation, a digital amplitude modulator is operated by controlling some of all power amplifiers in the ON state.

Figure 5:
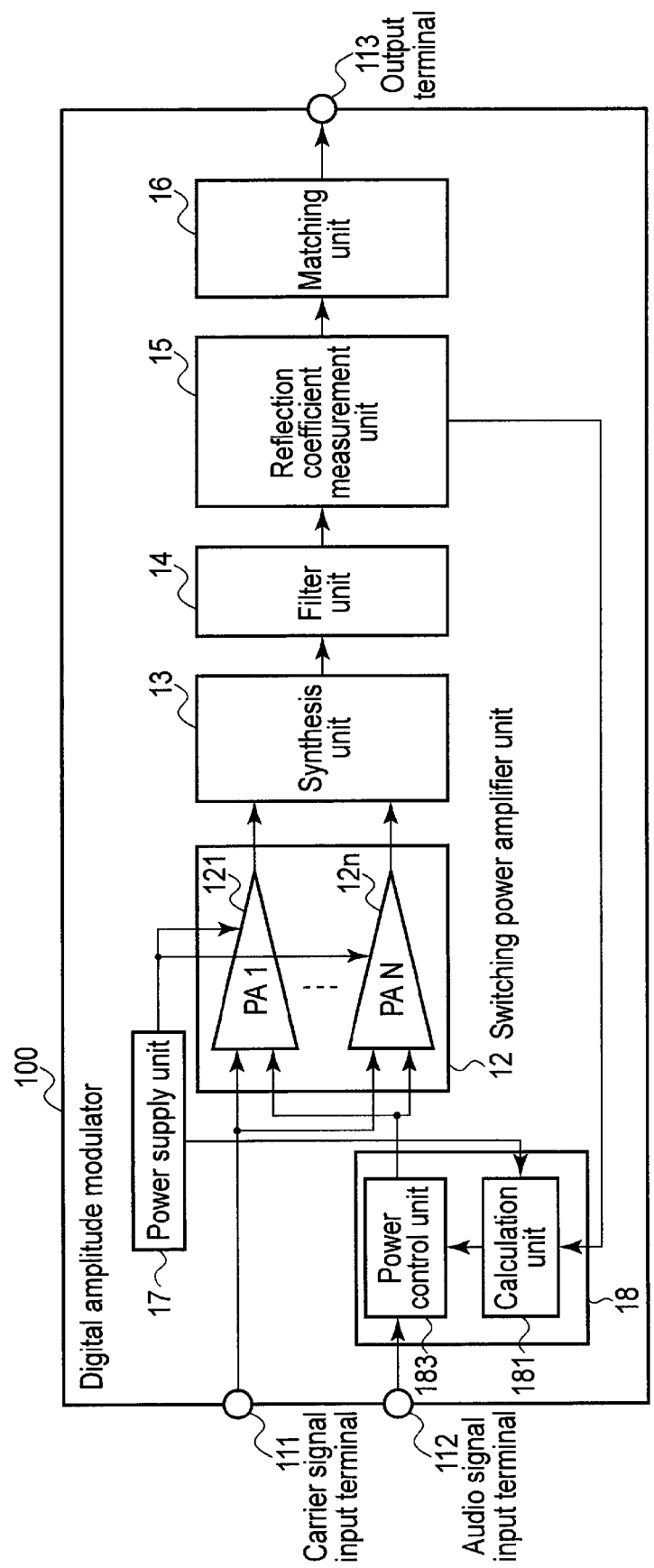
FIG. 5 is a block diagram showing the arrangement of a digital amplitude modulator according to the second embodiment.

FIG. 5 is a block diagram showing the arrangement of a digital amplitude modulator according to the second embodiment. Note that in FIG. 5, the same reference numerals as those in FIG. 1 denote the same parts and a detailed description thereof will be omitted.

In this example, at the time of the normal operation, the digital amplitude modulator is operated by setting only power amplifiers 121 to 128 in the ON state. A power control unit 183 of a control unit 180N/OFF-controls only power amplifiers 121 to 12n without controlling the input voltage of a power supply unit 17 at the time of an operation of decreasing or increasing transmission power.

An operation in the above arrangement will be described next.

The control unit 18 calculates reflected power Pref and loss power Ploss of each of the power amplifiers 121 to 128 in the ON state at the time of the normal operation.

The control unit 18 compares, with the first threshold, the sum of the loss power occurring in each of the power amplifiers 121 to 128 and the reflected power consumed by each of the power amplifiers 121 to 128. If the sum is higher than the first threshold, the control unit 18 performs processing of stopping the output of the apparatus, that is, processing of turning off the active power amplifiers 121 to 128.

On the other hand, if the sum of the loss power occurring in each of the power amplifiers 121 to 128 and the reflected power consumed by each of the power amplifiers 121 to 128 is equal to or lower than the first threshold, the control unit 18 determines the magnitude relationship between the second threshold lower than the first threshold and the sum of the loss power occurring in each of the power amplifiers 121 to 128 and the reflected power consumed by each of the power amplifiers 121 to 128.

If the sum of the loss power occurring in each of the power amplifiers 121 to 128 and the reflected power consumed by each of the power amplifiers 121 to 128 is lower than the second threshold, the control unit 18 maintains the ON state of each of the power amplifiers 121 to 128.

On the other hand, if the sum of the loss power occurring in each of the power amplifiers 121 to 128 and the reflected power consumed by each of the power amplifiers 121 to 128 is higher than the second threshold, the control unit 18 performs magnitude determination processing by comparing the sum with the third threshold. If the sum is higher than the third threshold, the control unit 18 executes an operation of decreasing the transmission power. This is implemented by controlling, for example, the power amplifiers 126 to 128 of the power amplifiers 121 to 128 in the ON state to be set in the OFF state.

On the other hand, if the sum is equal to or lower than the third threshold, the control unit 18 compares output power Pout with normal rated power Pspe. If the output power Pout is higher than the normal rated power Pspe, the control unit 18 executes an operation of decreasing the transmission power. If the output power Pout is equal to or lower than the normal rated power Pspe, the control unit 18 executes an operation of increasing the transmission power. That is, the control unit 18 controls the power amplifiers 129 to 12n, which are in the OFF state at the time of the normal operation, to be set in the ON state.

As described above, even in the second embodiment, it is possible to obtain the same operation effects as those in the first embodiment. Especially, it is unnecessary to control the power supply unit 17, and thus an inexpensive power supply unit 17 can be used.

Third Embodiment

According to the third embodiment, the number of power amplifiers to be turned off at the time of a power decreasing operation and the number of power amplifiers to be turned on at the time of a power increasing operation are changed under predetermined conditions.

Figure 6:
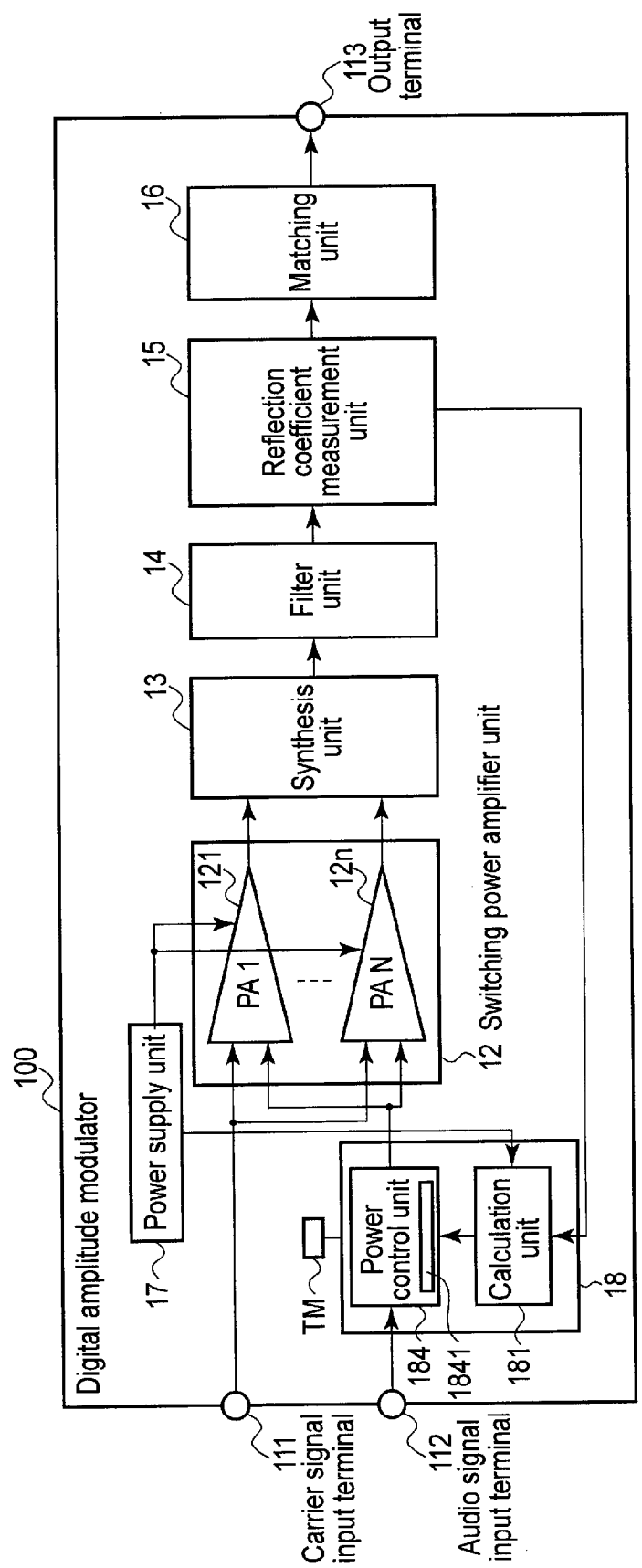
FIG. 6 is a block diagram showing the arrangement of a digital amplitude modulator according to the third embodiment.

FIG. 6 is a block diagram showing the arrangement of a digital amplitude modulator according to the third embodiment. Note that in FIG. 6, the same reference numerals as those in FIG. 5 denote the same parts and a detailed description thereof will be omitted.

An ON/OFF table 1841 is provided in a power control unit 184 of a control unit 18. The ON/OFF table 1841 stores first data shown in (a) of FIG. 7 and second data shown in (b) of FIG. 7.

In this state, for example, when the time counted by a timer TM becomes 17:00, the power control unit 184 switches the ON/OFF table 1841 from the second data to the first data. When the time becomes 9:00, the power control unit 184 switches the ON/OFF table 1841 from the first data to the second data.

After 9:00, if the sum of loss power occurring in each of power amplifiers 121 to 128 and reflected power consumed by each of the power amplifiers 121 to 128 is higher than the second threshold, the control unit 18 performs magnitude determination processing by comparing the sum with the third threshold. If the sum is higher than the third threshold, the control unit 18 executes an operation of decreasing the transmission power. This is implemented by controlling, for example, the power amplifiers 121 to 125 of the power amplifiers 121 to 128 in the ON state to be set in the OFF state.

On the other hand, if the sum is equal to or lower than the third threshold, the control unit 18 compares output power Pout with normal rated power Pspe. If the output power Pout is higher than the normal rated power Pspe, the control unit 18 executes an operation of decreasing the transmission power. If the output power Pout is equal to or lower than the normal rated power Pspe, the control unit 18 executes an operation of increasing the transmission power. That is, the control unit 18 controls power amplifiers 129 to 1211, which are in the OFF state at the time of the normal operation, to be set in the ON state.

Furthermore, after 17:00, if the sum of the loss power occurring in each of the power amplifiers 121 to 128 and the reflected power consumed by each of the power amplifiers 121 to 128 is higher than the second threshold, the control unit 18 performs magnitude determination processing by comparing the sum with the third threshold. If the sum is higher than the third threshold, the control unit 18 executes an operation of decreasing the transmission power. This is implemented by controlling, for example, the power amplifiers 124 to 128 of the power amplifiers 121 to 128 in the ON state to be set in the OFF state.

On the other hand, if the sum is equal to or lower than the third threshold, the control unit 18 compares the output power Pout with the normal rated power Pspe. If the output power Pout is higher than the normal rated power Pspe, the control unit 18 executes an operation of decreasing the transmission power. If the output power Pout is equal to or lower than the normal rated power Pspe, the control unit 18 executes an operation of increasing the transmission power. That is, the control unit 18 controls the power amplifiers 1211 to 12n, which are in the OFF state at the time of the normal operation, to be set in the ON state.

As described above, according to the third embodiment, it is possible to automatically change the power amplifiers which are turned off at the time of the operation of decreasing the transmission power and those which are turned on at the time of the operation of increasing the transmission power depending on the time. Note that as the switching conditions of the ON/OFF table 1841, for example, a use environment, a manual operation by an operator, and the like can be used in addition to date/time information.

Other Embodiments

Furthermore, the present invention is not directly limited to the above embodiments, but can be implemented, when practiced, by modifying the constituent elements without departing from the spirit and scope of the invention. Also, various inventions can be formed by appropriately combining a plurality of constituent elements disclosed in the aforementioned embodiments. For example, some of all the constituent elements described in the embodiments may be omitted. Furthermore, constituent elements over different embodiments may appropriately be combined.

While certain embodiments have been described, these embodiments have been presented by way of example only, and are not intended to limit the scope of the inventions. Indeed, the novel embodiments described herein may be embodied in a variety of other forms; furthermore various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A digital amplitude modulator comprising:
normal number of power amplifiers as at least some of a plurality of power amplifiers configured to amplify a power of a transmission signal, being juxtaposed and ON/OFF-controllable according to a voltage amplitude level of the transmission signal to be modulated;
a synthesizer configured to synthesize outputs of the respective power amplifiers to generate an amplitude modulation wave, and to send the generated amplitude modulation wave to a predetermined broadcasting service area;

a power supply unit configured to supply a power supply voltage to the plurality of power amplifiers;

a measurement unit configured to measure output power and a reflection coefficient of the synthesizer;

a calculation unit configured to calculate, based on the output power and the reflection coefficient that is measured by the measurement unit, and information of input power supplied by the power supply unit, loss power occurring in each power amplifier in an ON state and reflected power consumed by each power amplifier in the ON state, and a power controller configured to:
  control all the power amplifiers to be in an OFF state when a sum of the loss power and the reflected power that is calculated by the calculation unit is higher than a first threshold which is an upper limit of a tolerance range;
  perform a normal operation of setting the normal number of power amplifiers in the ON state when the sum is lower than a second threshold which is a lower limit of the tolerance range;
  compare the output power with normal rated power defined by digital broadcasting when the sum of the loss power and the reflected power falls within a range from the second threshold (inclusive) to the first threshold (inclusive); and
  control an input voltage of the power supply unit or ON/OFF of the plurality of power amplifiers to perform a power increasing operation of increasing the output power obtained at the time of the normal operation or a power decreasing operation of decreasing the output power obtained at the time of the normal operation, based on the comparison result.

2. The digital amplitude modulator according to claim 1, when a third threshold which is lower than the first threshold and higher than the second threshold is set within the tolerance range, if the sum of the loss power and the reflected power is higher than the third threshold, wherein the power controller controls the input voltage of the power supply unit or ON/OFF of the plurality of power amplifiers to perform the power decreasing operation, and if the sum of the loss power and the reflected power is not higher than the third threshold, wherein the power controller compares the output power measured by the measurement unit with the normal rated power, and controls, based on the comparison result, the input voltage of the power supply unit or ON/OFF of the plurality of power amplifiers to perform the power decreasing operation or the power increasing operation.

3. The digital amplitude modulator according to claim 1, wherein the power controller controls the input voltage of the power supply unit or ON/OFF of the plurality of power amplifiers to perform the power decreasing operation when the output power measured by the measurement unit is higher than the normal rated power, and controls the input voltage of the power supply unit or ON/OFF of the plurality of power amplifiers to perform the power increasing operation when the output power is not higher than the normal rated power.

4. The digital amplitude modulator according to claim 1, wherein the measurement unit measures traveling power and reflected power.

5. The digital amplitude modulator according to claim 1, wherein the information of the input power supplied by the power supply unit is information of the power supply voltage and information of a power supply current.

6. The digital amplitude modulator according to claim 1, wherein the reflection coefficient measured by the measurement unit is calculated based on a load impedance and a matching impedance.

7. The digital amplitude modulator according to claim 1, wherein the power controller controls ON/OFF of the plurality of power amplifiers to perform the power decreasing operation or the power increasing operation based on a plurality of patterns.

8. The digital amplitude modulator according to claim 1, wherein the measurement unit obtains the reflection coefficient by a combination of signals that include the same amplitude and phases different from each other by $\pi/2$.

9. A control method for a digital amplitude modulator includes normal number of power amplifiers as at least some of a plurality of power amplifiers configured to amplify a power of a transmission signal, being juxtaposed and ON/OFF-controllable according to a voltage amplitude level of the transmission signal to be modulated, a synthesizer configured to synthesize outputs of the respective power amplifiers to generate an amplitude modulation wave, and to send the generated amplitude modulation wave to a predetermined broadcasting service area, the method comprising:
  supplying a power supply voltage to the plurality of power amplifiers using a power supply unit;
  measuring output power and a reflection coefficient of the synthesizer;
  calculating, based on the output power, the reflection coefficient, and information of input power supplied by the power supply unit, loss power occurring in each power amplifier in an ON state and reflected power consumed by each power amplifier in the ON state, and
  controlling all the power amplifiers to be in an OFF state when a sum of the loss power and the reflected power is higher than a first threshold which is an upper limit of a tolerance range,
  performing a normal operation of setting the normal number of power amplifiers in the ON state when the sum is lower than a second threshold which is a lower limit of the tolerance range,
  comparing the output power with normal rated power defined by digital broadcasting when the sum of the loss power and the reflected power falls within a range from the second threshold (inclusive) to the first threshold (inclusive), and
  controlling an input voltage of the power supply unit or ON/OFF of the plurality of power amplifiers to perform a power increasing operation of increasing the output power obtained at the time of the normal operation or a power decreasing operation of decreasing the output power obtained at the time of the normal operation, based on the comparison result.

* * * * *